United States Patent
Kim et al.

(10) Patent No.: US 10,366,635 B2
(45) Date of Patent: Jul. 30, 2019

(54) FLEXIBLE DISPLAY DEVICE AND METHOD OF MANUFACTURING FLEXIBLE DISPLAY DEVICE

(71) Applicant: Samsung Display Co., Ltd., Yongin-si, Gyeonggi-do (KR)

(72) Inventors: Hyeonsik Kim, Yongin-si (KR); Chaungi Choi, Yongin-si (KR); Hyehyang Park, Yongin-si (KR); Eunyoung Lee, Yongin-si (KR); Joohee Jeon, Yongin-si (KR); Seungho Jung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 15 days.

(21) Appl. No.: 15/643,100

(22) Filed: Jul. 6, 2017

(65) Prior Publication Data
US 2018/0018907 A1    Jan. 18, 2018

(30) Foreign Application Priority Data

Jul. 12, 2016  (KR) .................. 10-2016-0088046

(51) Int. Cl.
| | |
|---|---|
| *G09F 9/30* | (2006.01) |
| *G06F 1/16* | (2006.01) |
| *H01L 51/00* | (2006.01) |
| *H01L 51/52* | (2006.01) |
| *H01L 27/32* | (2006.01) |
| *H01L 51/56* | (2006.01) |

(52) U.S. Cl.
CPC .......... *G09F 9/301* (2013.01); *H01L 51/0097* (2013.01); *H01L 51/5253* (2013.01); *G06F 1/1652* (2013.01); *H01L 27/3258* (2013.01); *H01L 51/56* (2013.01); *H01L 2251/5338* (2013.01); *H01L 2251/566* (2013.01)

(58) Field of Classification Search
CPC .................................................. H01L 27/3258
See application file for complete search history.

(56) References Cited

U.S. PATENT DOCUMENTS

| | | | | |
|---|---|---|---|---|
| 5,757,126 | A * | 5/1998 | Harvey, III | H01L 51/0097 313/504 |
| 6,576,351 | B2 * | 6/2003 | Silvernail | H01L 51/5256 257/100 |
| 6,664,137 | B2 * | 12/2003 | Weaver | H01L 25/047 257/E25.009 |
| 7,198,832 | B2 * | 4/2007 | Burrows | H01L 23/562 257/28 |
| 7,355,341 | B2 * | 4/2008 | Yoshizawa | H01L 51/0097 313/504 |

(Continued)

FOREIGN PATENT DOCUMENTS

| | | |
|---|---|---|
| JP | 2015-204239 A | 11/2015 |
| KR | 10-2008-0001189 A | 1/2008 |

(Continued)

*Primary Examiner* — Eugene Lee
(74) *Attorney, Agent, or Firm* — Innovation Counsel LLP

(57) ABSTRACT

A flexible display device may include a substrate and a display unit provided over the substrate. The substrate may include: a first base layer, a second base layer provided over the first base layer, and a first barrier layer provided between the first and second base layers. A face of the first base layer is larger than a face of the second base layer and is parallel to the face of the second base layer.

5 Claims, 3 Drawing Sheets

(56) References Cited

U.S. PATENT DOCUMENTS

| | | | |
|---|---|---|---|
| 8,772,760 B2 | 7/2014 | Nam et al. | |
| 9,876,064 B2* | 1/2018 | Kim | H01L 27/3258 |
| 9,893,088 B2* | 2/2018 | Sugawara | H01L 27/1225 |
| 2003/0104753 A1 | 6/2003 | Graff et al. | |
| 2003/0197197 A1* | 10/2003 | Brown | H01L 51/5246 |
| | | | 257/200 |
| 2011/0139747 A1* | 6/2011 | Lee | H01L 51/0096 |
| | | | 216/37 |
| 2012/0001534 A1 | 1/2012 | Kim | |
| 2013/0140547 A1* | 6/2013 | Lee | H01L 27/3274 |
| | | | 257/40 |
| 2014/0225089 A1* | 8/2014 | Kato | H01L 51/5253 |
| | | | 257/40 |
| 2015/0060778 A1* | 3/2015 | Kim | H01L 27/3258 |
| | | | 257/40 |
| 2015/0091030 A1* | 4/2015 | Lee | H01L 27/3246 |
| | | | 257/91 |
| 2016/0155788 A1* | 6/2016 | Kwon | H01L 27/3276 |
| | | | 257/40 |

FOREIGN PATENT DOCUMENTS

| | | |
|---|---|---|
| KR | 10-2011-0092582 A | 8/2011 |
| KR | 10-2012-0003664 A | 1/2012 |

\* cited by examiner

FLEXIBLE DISPLAY DEVICE AND METHOD OF MANUFACTURING FLEXIBLE DISPLAY DEVICE

CROSS-REFERENCE TO RELATED APPLICATION

This application claims the benefit of Korean Patent Application No. 10-2016-0088046, filed on Jul. 12, 2016, in the Korean Intellectual Property Office; the Korean Patent Application is incorporated herein in its entirety by reference.

BACKGROUND

1. Field

The technical field is related to a flexible display device and a method of manufacturing a flexible display device.

2. Description of the Related Art

A display device, such as a liquid crystal display (LCD), an organic light-emitting diode display (OLED), an electrophoretic display (EPD), or a plasma display panel (PDP), may display images according to input signals.

A flexible display device may be folded or unfolded in one or more directions.

In a flexible display device, a substrate is typically formed of a flexible plastic material, and thus the flexible display device may be vulnerable to penetration of moisture and oxygen.

SUMMARY

One or more embodiments may be related to a flexible display device including a reliable substrate for preventing penetration of moisture and oxygen. One or more embodiments may be related to a method of manufacturing the flexible display device.

According to one or more embodiments, a flexible display device includes the following elements and/or features: a substrate; and a display portion (or display unit) provided over the substrate, wherein the substrate may include: a first base layer; a second base layer provided over the first base layer; and a first barrier layer provided between the first and second base layers, and an area of the first base layer is larger than an area of the second base layer.

The substrate may further include a second barrier layer provided between the second base layer and the display portion.

The first barrier layer and the second barrier layer may contact each other at an outer region of the substrate.

The second base layer may be surrounded by the first barrier layer and the second barrier layer.

The first barrier layer and the second barrier layer may each include an inorganic insulating film.

The first base layer and the second base layer may each be formed of at least one of polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

The flexible display device may further include an encapsulation portion provided over the display portion to seal the display portion from external oxygen or moisture.

The display portion may include: at least one thin-film transistor; and an organic light-emitting device electrically connected to the thin-film transistor.

One or more embodiments may be related to a method of manufacturing a flexible display device. The method includes the following steps: preparing a mother substrate; forming a first base layer over the mother substrate by using a first nozzle; and forming a second base layer over the first base layer by using a second nozzle, wherein the first base layer is formed throughout the mother substrate, and the second base layer is patterned to have a smaller area than the first base layer.

The method may further include, after the forming of the first base layer, forming a first barrier layer over the first base layer.

The method may further include, after the forming of the second base layer, forming a second barrier layer over the second base layer.

The first barrier layer and the second barrier layer may be connected to each other at a region outside the second base layer.

At least one of the first base layer and the second base layer may be formed by at least one photoresist process and may be formed of at least one of polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

The first barrier layer and the second barrier layer may each be formed of at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zirconium oxide ($ZrO_2$).

The method may further include, after the forming of the second barrier layer, forming a display portion (or display unit) over the second barrier layer.

The method may further include, after the forming of the display portion, forming an encapsulation portion (or encapsulation unit) for protecting/sealing the display portion from at least one of external oxygen and moisture.

One or more embodiments may be related to a flexible display device. The display device may include a substrate and a display unit provided over the substrate. The substrate may include a first base layer, a second base layer provided over the first base layer, and a first barrier layer provided between the first and second base layers. A face of the first base layer may be larger than a face of the second base layer and may be parallel to the face of the second base layer.

The substrate may include a second barrier layer provided between the second base layer and the display unit.

The first barrier layer and the second barrier layer may contact each other at an outer region of the substrate.

The second base layer may be surrounded by the first barrier layer and the second barrier layer.

The first barrier layer may include a first inorganic insulating film. The second barrier layer may include a second inorganic insulating film.

The first base layer and the second base layer may be each formed of at least one of polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

The flexible display device may include an encapsulation unit provided over the display unit to encapsulate the display unit. The encapsulation unit may directly contact the substrate. The encapsulation unit may directly contact the second barrier layer.

A face of the first barrier layer may be larger than the face of the second base layer and may be parallel to the face of the second base layer.

One or more embodiments may be related to a method of manufacturing a flexible display device. The method may include the following steps: preparing a mother substrate; forming a first base layer over the mother substrate using a first nozzle; and forming a second base layer over the first base layer using a second nozzle. A face of the second base layer may be smaller than a face of the first base layer and may be parallel to the face of the first base layer.

The method may include the following step: after the forming of the first base layer, forming a first barrier layer over the first base layer.

The method may include the following step: after the forming of the second base layer, forming a second barrier layer over the second base layer.

The first barrier layer may directly contact two portions of the second barrier layer. The second base layer may be positioned between the two portions of the second barrier layer.

The second base layer may be formed by a photoresist process and may be formed of at least one of polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

The first barrier layer and the second barrier layer may be each formed of at least one of silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), and zirconium oxide (ZrO2).

The method may include the following step: after the forming of the second barrier layer, forming a display unit over the second barrier layer.

The method may include the following step: after the forming of the display unit, forming an encapsulation unit that directly contacts the substrate and encapsulates the display unit.

The method may include adding a blocking member to the first nozzle to form the second nozzle.

The method may include adding a blocking member to a center of the first nozzle to form the second nozzle.

The method may include adding a plurality of blocking members to the first nozzle to form the second nozzle.

The method may include the following steps: forming a first barrier layer, which may be positioned between the first base layer and the second base layer; and forming a second barrier layer. The second base layer may be positioned between the first barrier layer and the second barrier layer. Portions of the second barrier layer may directly contact the first barrier layer and may surround the second base layer.

DETAILED DESCRIPTION

Example embodiments are described with reference to the accompanying drawings. Practical embodiments may have different forms and should not be construed as being limited to the descriptions set forth herein.

While terms such as "first", "second", etc., may be used to describe various components, such components may not be limited by the terms. The terms may be used to distinguish one component from another. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

An expression used in the singular may encompass the expression of the plural, unless it has a clearly different meaning in the context.

In the present specification, terms such as "including" or "having", are intended to indicate the existence of the recited features or components, and are not intended to preclude the possibility of existence of one or more other features or components.

When a first element (e.g., a component or layer) is referred to as being "on" a second element, the first element can be directly on the second element, or one or more intervening elements may exist between the first element and the second element.

The term "and/or" includes any and all combinations of one or more of the associated items.

In drawings, sizes of components may be exaggerated for clarity. The sizes and thicknesses may not limit possible embodiments.

In embodiments, a specific process order may be performed differently from the described order. For example, two consecutively described processes may be performed substantially at the same time or performed in an order opposite to the described order.

Figure 1:
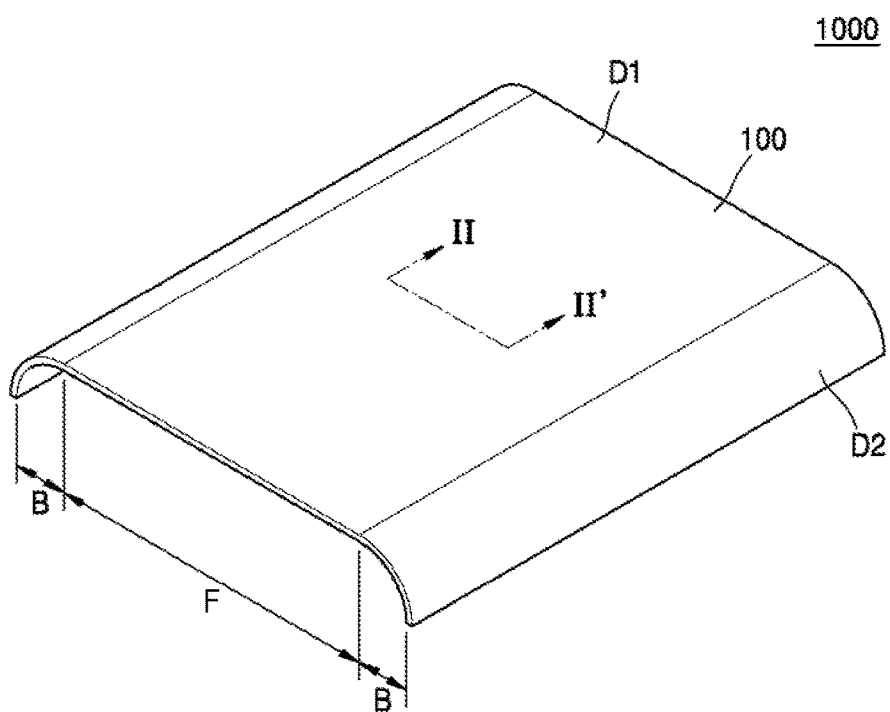
FIG. 1 is a perspective view of a flexible display device according to an embodiment.
Figure 2:
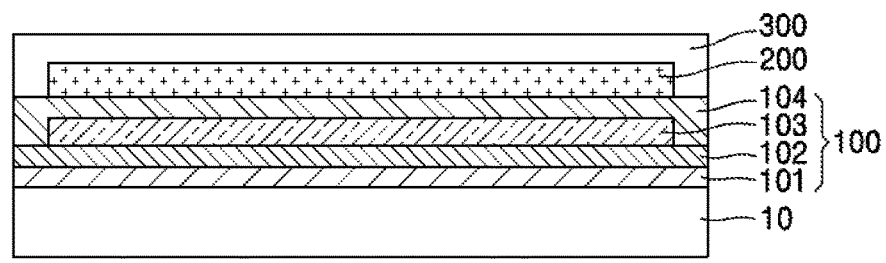
FIG. 2 is a cross-sectional view taken along a line II-II' of FIG. 1 according to an embodiment.
Figure 3:
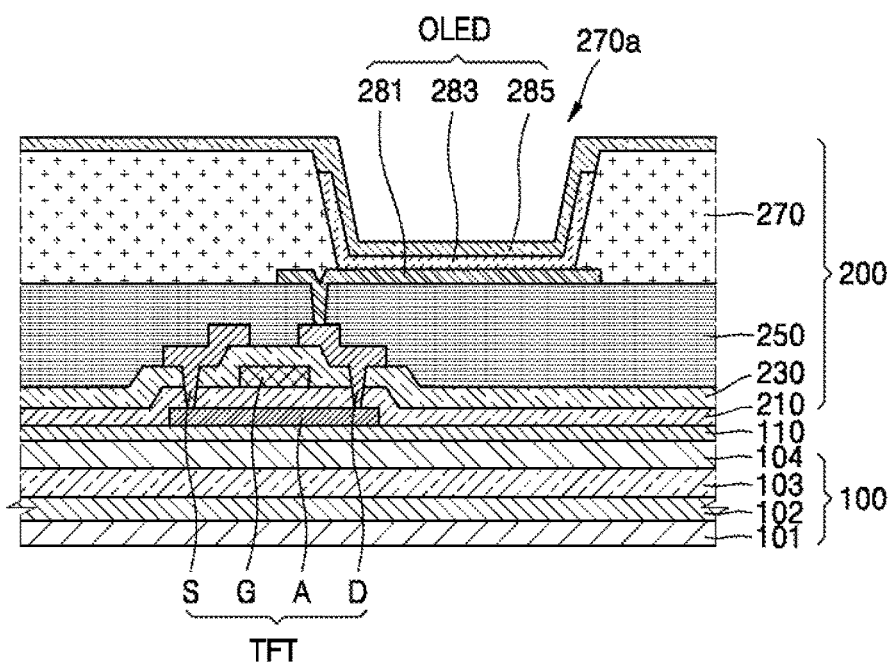
FIG. 3 is a cross-sectional view illustrating a display portion (or display unit) according to an embodiment.

FIG. 1 is a perspective view of a flexible display device 1000 according to an embodiment. FIG. 2 is a cross-sectional view taken along a line II-II' of FIG. 1 according to an embodiment. FIG. 3 is a cross-sectional view illustrating a display portion 200 (or display unit 200) of the display device 1000 according to an embodiment.

Referring to FIG. 1, FIG. 2, and FIG. 3, the flexible display device 1000 may include a substrate 100 and the display portion 200 over the substrate 100, and the display portion 200 may include a first display region D1 and a second display region D2

The substrate 100 may include a flat region F and at least one curved region B. The curved region B is connected to the flat region F. In FIG. 1, the substrate 100 includes a pair of curved regions B respectively provided on two sides of the flat region F. The pair of curved regions B may have the same shape or different shapes. The pair of curved regions B may have equal curvatures or unequal curvatures. In embodiments, one or more curved regions B may be formed at only one edge of the flat region F, on all edges of the flat region F, or inside the flat region F.

The substrate 100 may include a first base layer 101, a first barrier layer 102, a second base layer 103, and a second barrier layer 104, which are sequentially stacked.

The base layers 101 and 103 may be formed of at least one flexible plastic material, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), or cellulose acetate propionate (CAP).

According to an embodiment, the base layers 101 and 103 may be formed of polyimide. According to an embodiment, the base layers 101 and 103 may be formed of different plastic materials.

The flexible display device 1000 may include the first base layer 101 having an area (e.g., top/bottom area) larger than that (e.g., top/bottom area) of the second base layer 103, as shown in FIG. 2.

In embodiments, the second base layer 103 may be provided only at a part of the first base layer 101. Accordingly, the first barrier layer 102 (provided between the base layers 101 and 103) may directly contact the second barrier layer 104 (provided over the first barrier layer 102 and the second base layer 103) at an outer region of the substrate 100. In a cross-sectional view, two portions of the second barrier layer 104 may directly contact the first barrier layer 102. The second base layer 103 may be positioned between the two portions of the second barrier layer 104. The second base layer 103 may be surrounded by portions of the second barrier layer 104.

The outer region of the substrate 100 may include, from among an entire region of the substrate 100, a region closer to the four corners of the substrate 100 than to the center of the substrate 100.

If the substrate 100 were formed of only a flexible plastic material, external oxygen and/or moisture might enter the flexible display device 1000 through the substrate 100, and might affect the reliability of the flexible display device 1000.

In embodiments, the flexible display device 1000 includes the second base layer 103 having a smaller area than the first base layer 101, as shown in FIG. 2, and thus the first and second barrier layers 102 and 104 are connected to each other at the outer region of the substrate 100. Advantageously, the substrate 100 may effectively block external oxygen or moisture.

According to an embodiment, the first barrier layer 102 may include a first inorganic insulating layer, and the second barrier layer 104 may include a second inorganic insulating layer. For example, at least one of the barrier layers 102 and 104 may be formed of a metal oxide or a metal nitride. For example, the first inorganic insulating layer and/or the second inorganic layer may be formed of at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zirconium oxide ($ZrO_2$).

The barrier layers 102 and 104 may be formed of the same material or different materials.

In embodiments, the barrier layers 102 and 104 formed of an inorganic material may have lower penetration and mobility of oxygen and/or moisture than the base layers 101 and 103 formed of a plastic material. The second base layer 103 (provided closer to the display portion 200) is surrounded by the barrier layers 102 and 104, and thus oxygen and/or moisture may be substantially or completely blocked from the display portion 200.

Referring to FIG. 2, the display portion 200 is provided over the substrate 100 for displaying an image. The display portion 200 may include, for example, a thin-film transistor TFT and an organic light-emitting device OLED. In an embodiment, the display portion 200 may include one or more of other types of display devices.

The display portion 200 is further described with reference to FIG. 3.

A buffer layer 110 may be formed over the substrate 100. The buffer layer 110 may prevent diffusion of impure ions into the display portion 200, may prevent moisture or external atmosphere from entering the display portion 200, and/or may flatten a surface of the substrate 100. The buffer layer 110 may include, for example, an inorganic material such as silicon oxide, silicon nitride, silicon oxynitride, aluminum oxide, aluminum nitride, titanium oxide, or titanium nitride, and/or an organic material such as polyimide, polyester, or acryl. The buffer layer 110 may have a stacked structure.

The thin-film transistor TFT may be formed over the substrate 100. The thin-film transistor TFT may include a semiconductor layer A, a gate electrode G, a source electrode S, and a drain electrode D. In FIG. 3, the thin-film transistor TFT is a top gate type in which the semiconductor layer A is positioned between the gate electrode G, and the substrate 100. In an embodiment, the thin-film transistor TFT may be of a different type, such as of a bottom gate type.

The semiconductor layer A may be formed of an inorganic semiconductor, such as silicon, or an organic semiconductor. The semiconductor layer A has a source region, a drain region, and a channel region between the source region and the drain region. For example, the semiconductor layer A may be formed by forming an amorphous silicon layer on a front surface of the substrate 100, crystallizing the amorphous silicon layer to form a polycrystalline silicon layer, patterning the polycrystalline silicon layer, and then doping the source and drain regions with impurities.

After the semiconductor layer A is formed, a gate insulating layer 210 may be formed over the substrate 100 and over the semiconductor layer A. The gate insulating layer 210 may include a multilayer film or a single layer film formed of at least an inorganic material, such as silicon oxide or silicon nitride. The gate insulating layer 210 insulates the semiconductor layer A from the gate electrode G provided over the semiconductor layer A.

The gate electrode G is formed over the gate insulating layer 210. The gate electrode G is connected to a gate line (not shown) receiving an on/off signal used in control of the thin-film transistor TFT. A material for forming the gate electrode G may include at least one metal, such as at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). The gate electrode G may be formed of at least one of other materials.

After the gate electrode G is formed, an interlayer insulating layer 230 may be formed over the substrate 100 to insulate the gate electrode G from each of the source electrode S and the drain electrode D.

The interlayer insulating layer 230 may be formed of an inorganic material. For example, the interlayer insulating layer 230 may be formed of a metal oxide or a metal nitride. The inorganic material may include $SiO_2$, SiNx, SiON, $Al_2O_3$, $TiO_2$, $Ta_2O_5$, $HfO_2$, and $ZrO_2$.

The interlayer insulating layer 230 may include multiple layers or a single layer of a film formed of an inorganic material, such as SiOx and/or SiNx. According to an embodiment, the interlayer insulating layer 230 may have a double-layer structure including SiOx and SiNy or including SiNx and SiOy.

The source electrode S and the drain electrode D are formed over the interlayer insulating layer 230. For example, the interlayer insulating layer 230 and the gate insulating layer 210 expose the source and drain regions of the semiconductor layer A, and the source and drain electrodes S and D are formed to respectively contact the exposed source and drain regions of the semiconductor layer A.

The electrodes S and D may each include a single layer or a multilayer formed of at least one of Al, Pt, Pd, Ag, Mg, Au, Ni, Nd, Ir, Cr, Li, Ca, Mo, Ti, W, and Cu.

The thin-film transistor TFT is electrically connected to the organic light-emitting device OLED and may apply a signal for driving the organic light-emitting device OLED to the organic light-emitting device OLED. The thin-film transistor TFT may be covered and protected by a planarization layer 250.

The planarization layer 250 may include an inorganic insulating layer and/or an organic insulating layer. The inorganic insulating layer may include at least one of SiOx, SiNx, SiON, Al2O3, TiO2, Ta2O5, HfO2, ZrO2, BST, and lead zirconate titanate (PZT), and the organic insulation layer may include at least one of a general-purpose polymer (polymethyl methacrylate (PMMA) or polystyrene (PS)), a polymer derivative having a phenol group, an acryl-based polymer, an imide-based polymer, an arylether-based polymer, an amide-based polymer, a fluorine-based polymer, a p-xylan-based polymer, a vinyl alcohol-based polymer, and a blend. In an embodiment, the planarization layer 250 may be formed of a complex stacked structure including an inorganic insulation layer and an organic insulation layer.

The organic light-emitting device OLED may be provided over the planarization layer 250. The organic light-emitting device OLED may include a first electrode 281, an intermediate layer 283 including an organic emission layer, and a second electrode 285. Holes and electrons respectively injected from the electrodes 281 and 285 of the organic light-emitting device OLED may combine in the organic emission layer of the intermediate layer 283 to generate light.

The first electrode 281 is formed over the planarization layer 250 and is electrically connected to the drain electrode D through a contact hole formed in the planarization layer 250. In an embodiment, the first electrode 281 may be electrically connected to the source electrode S to receive a signal for driving the organic light-emitting device OLED.

The first electrode 281 may be a reflective electrode, and may include a reflective film formed of at least one of Ag, Mg, Al, Pt, Pd, Au, Ni, Nd, Ir, and Cr. The first electrode 281 may include a transmissive electrode layer formed on a reflective film. The transmissive electrode layer may include at least one of among indium tin oxide (ITO), indium zinc oxide (IZO), zinc oxide (ZnO), indium oxide (In2O3), indium gallium oxide (IGO), and aluminum zinc oxide (AZO).

The intermediate layer 283 may include the organic emission layer. The intermediate layer 283 may further include at least one of a hole injection layer (HIL), a hole transport layer (HTL), an electron transport layer (ETL), and an electron injection layer (EIL). The intermediate layer 283 may include one or more of other functional layers.

The second electrode 285 is formed over the intermediate layer 283. The second electrode 285 forms an electric field with the first electrode 281 such that light is emitted from the intermediate layer 283. The first electrode 281 may be patterned according to pixels, and the second electrode 285 may apply a common voltage to the pixels.

The second electrode 285 facing the first electrode 281 may be a transparent or semi-transparent electrode. The second electrode 285 may be a thin film formed of a metal having a low work function, such as Li, Ca, LiF/Ca, LiF/Al, Al, Ag, Mg, or an alloy. An auxiliary electrode layer or a bus electrode may be formed on the thin film using a transparent electrode-forming material, such as ITO, IZO, ZnO, or In2O3.

Accordingly, the second electrode 285 may transmit light emitted from the organic emission layer included in the intermediate layer 283. In embodiments, the light emitted from the organic emission layer is emitted to the second electrode 285 directly and/or after being reflected by the first electrode 281.

In an embodiment, the display portion 200 may be of a bottom emission type in which light emitted from the organic emission layer is emitted towards the substrate 100. In an embodiment, the first electrode 281 may be a transparent or semi-transparent electrode, and the second electrode 285 may be a reflective electrode. In an embodiment, the display portion 200 according to the current embodiment may be a dual emission type in which light is emitted in both front and rear directions.

According to an embodiment, the first electrode 281 may be patterned according to pixels. The display portion 200 may further include a pixel-defining layer 270 formed over the first electrode 281. The pixel-defining layer 270 may include an opening 270a exposing the first electrode 281. The intermediate layer 283 may be formed in the opening 270a to be electrically connected to the first electrode 281. The pixel-defining layer 270 may be formed by a spin-coating method using at least one organic insulating material, such as at least one of polyimide, polyamide, acryl resin, benzocyclobutene, and phenol resin.

As shown in FIG. 2, the flexible display device 1000 may further include an encapsulation portion 300 encapsulating/sealing the display portion 200.

According to an embodiment, the encapsulation portion 300 may be formed over the display portion 200, and may have two ends closely adhered to and/or directly contacting the substrate 100. According to an embodiment, the encapsulation portion 300 may have a structure in which thin film layers are stacked, wherein organic films and inorganic films are alternately stacked. In an embodiment, the encapsulation portion 300 may include only one film/layer.

The inorganic film(s) may prevent penetration/intrusion of oxygen or moisture, and the organic film(s) may absorb stress of the inorganic film.

According to an embodiment, the inorganic film may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The organic film may include PMMA, PC, PS, acryl-based resin, epoxy-based resin, polyimide, or polyethylene.

Figure 4A:
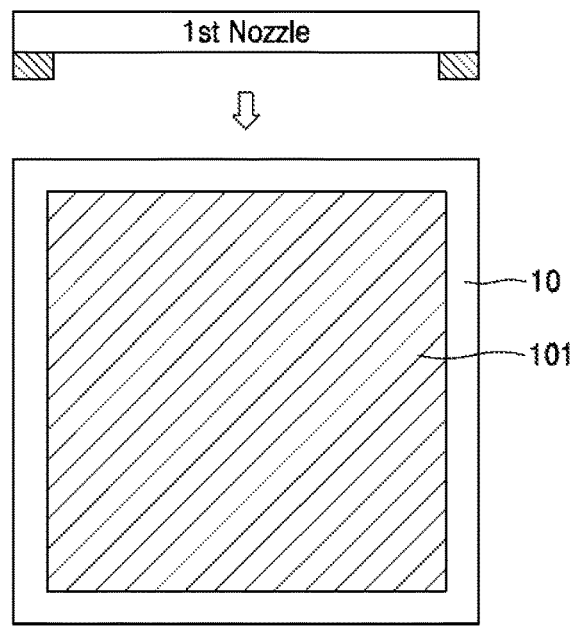
FIG. 4A and FIG. 4B are views illustrating steps in a method of manufacturing a flexible display device according to an embodiment.
Figure 4B:
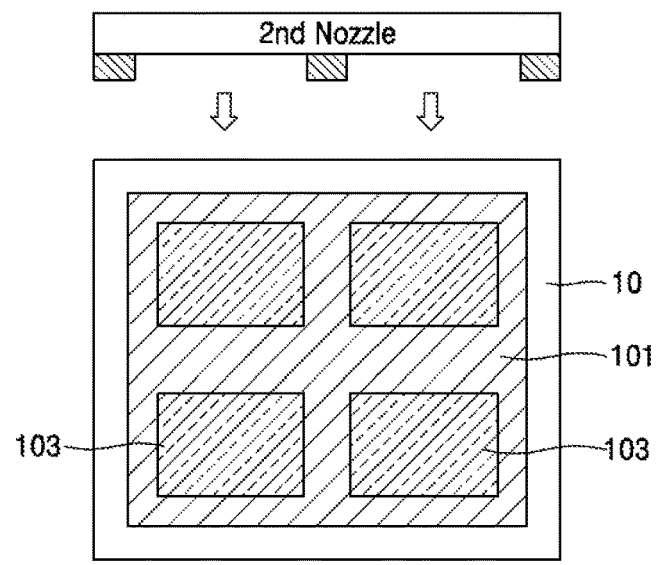

FIGS. 4A and 4B are views illustrating steps in a method of manufacturing a flexible display device, such as the flexible display device 1000, according to an embodiment.

Referring to FIG. 4A, a mother substrate 10 is prepared first, and the first base layer 101 may be formed over the mother substrate 10 using a first nozzle.

Here, the first base layer 101 may cover the majority of a face of the mother substrate 10, as shown in FIG. 4A.

According to an embodiment, the first base layer 101 may be formed of a flexible plastic material. For example, the first base layer 101 may be formed of at least one of PES, PAR, PEI, PEN, PET, PPS, polyarylate, polyimide, PC, TAC, and CAP.

In an embodiment, the first base layer 101 may be formed using a flexible plastic material.

Then, although not shown in FIG. 4A, the first barrier layer 102 may be formed over/on the first base layer 101, as shown in FIG. 2.

According to an embodiment, the first barrier layer 102 may be an inorganic insulating layer, and the first barrier layer 102 may be formed by coating an inorganic insulating material throughout a face (e.g., top face) of the first base layer 101. For example, the first barrier layer 102 may be formed of metal oxide or metal nitride. The first barrier layer 102 may be formed of an inorganic material, such as $SiO_2$, $SiNx$, $SiON$, $Al_2O_3$, $TiO_2$, $Ta_2O_5$, $HfO_2$, or $ZrO_2$.

According to an embodiment, the first barrier layer 102 may be formed throughout an upper portion of the first base layer 101. In an embodiment, the first barrier layer 102 may be formed by coating the same area as the first base layer 101 without having to use a separate nozzle.

Then, referring to FIG. 4B, a plurality of second base layers 103 may be formed using a second nozzle that is different from the first nozzle.

Like the first base layer 101, the second base layers 103 may be formed of a flexible plastic material. For example, the second base layer 103 may be formed of at least one of PES, PAR, PEI, PEN, PET, PPS, polyarylate, PC, TAC, and CAP.

The second base layers 103 may be formed of a material that is same as or different from that of the first base layer 101.

The second base layer 103 may be patterned into cell units instead of being formed as one body like the first base layer 101.

According to an embodiment, referring to FIG. 4B, four second base layers 103 may be formed by additionally forming a blocking member at a center of the first nozzle to obtain the second nozzle.

The method may include determining one or more locations of blocking members to be added to the first nozzle for forming the second nozzle. The method may include determining the number of second base layers 103 to be formed on a first second base layer 101. The second base layers 103 may be formed by coating regions based on the determined number of second base layers 103 (or the number of desired cells) using one or more suitable second nozzles.

According to an embodiment, a plurality of second base layers 103 may be formed on a same first base layer 101 in a same process.

An area (e.g., top area) of each of the second base layers 103 may be smaller than that (e.g., top area) of the first base layer 101.

Then, although not shown in FIG. 4B, the second barrier layer 104 may be formed over the second base layer 103, as shown in FIG. 2.

According to an embodiment, the second barrier layer 104 may be an inorganic insulating layer. The second barrier layer 104 may be formed by depositing an inorganic insulating material over the second base layer 103.

For example, the second barrier layer 104 may be formed of PES, PAR, PEI, PEN, PET, PPS, polyarylate, PC, TAC, or CAP.

The second barrier layer 104 may be formed of a material that is same as or different from that of the first barrier layer 102.

Here, the second barrier layer 104 may substantially cover the top face of the mother substrate 10, like the first barrier layer 102.

In embodiments, a material layer for forming the second base layers 103 is patterned into cell units that respectfully include the second base layers 103. However, the second barrier layer 104 may cover substantially the same area as the first base layer 101 and/or the first barrier layer 102, and may substantially cover the top face of the mother substrate 10.

According to an embodiment, the barriers 102 and 104 may be connected to each other and may directly contact each other outside the second base layers 103. Referring to FIGS. 2 and 4B, since each of the second base layers 103 has a smaller area than the first base layer 101, the barrier layers 102 and 104 may be directly connected to each other outside the second base layer 103. Portions of the second barrier layer 104 that directly connect to the first barrier layer 102 may surround the second base layers 103.

As a result, each of the second base layers 103 may be surrounded by the first barrier layer 102 and the second barrier layer 104.

Since each of the second base layers 103 is surrounded by the barrier layers 102 and 104 (formed of inorganic materials), external moisture and/or oxygen is blocked, and thus the reliability of the display portion 200 may be optimized.

Then, although not shown in FIG. 4B, the mother substrate 10 may be cut into cell units. As a result, the substrate 100 of each cell may be formed as shown in FIG. 2.

The area of each second base layer 103 may be smaller than the area of the first base layer 101, and accordingly, the corresponding barrier layers 102 and 104 may be connected to each other at the outer region of the associated substrate 100.

In embodiments, the second base layer 103 close to the display portion 200 is surrounded by the barrier layers 102 and 104, and external moisture and/or oxygen may be effectively blocked from the display portion 200, and thus the reliability of the display portion 200 and/or the display device 1000 may be maximized.

It should be understood that embodiments described herein should be considered in a descriptive sense and not for purposes of limitation. Descriptions of features or aspects in each embodiment should typically be available for other similar features or aspects in other embodiments.

While embodiments have been described with reference to the figures, it will be understood by those of ordinary skill in the art that various changes in form and details may be made to the described embodiments without departing from the spirit and scope defined by the following claims.

What is claimed is:
1. A flexible display device comprising:
a substrate; and
a display unit provided over the substrate,
wherein the substrate comprises:
a first base layer including a first organic material;
a second base layer including a second organic material, provided over the first base layer;
a first barrier layer including a first inorganic material, provided between the first and second base layers; and
a second barrier layer including a second inorganic material, provided between the second base layer and the display unit,
wherein a face of the first base layer is larger than a face of the second base layer and is parallel to the face of the second base layer, wherein a first face of the second barrier layer is as substantially the same size as the face of the first base layer, wherein a second face of the second barrier layer directly contacts the face of the second base layer, and wherein the first base layer directly contacts the first barrier layer.

2. The flexible display device of claim 1, wherein the first barrier layer and the second barrier layer contact each other at an outer region of the substrate.

3. The flexible display device of claim 1, wherein the second base layer is surrounded by the first barrier layer and the second barrier layer.

4. The flexible display device of claim 1, wherein the first base layer and the second base layer are each formed of at least one of polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and cellulose acetate propionate (CAP).

5. The flexible display device of claim 1, further comprising an encapsulation unit provided over the display unit to encapsulate the display unit, wherein the encapsulation unit directly contacts the substrate.

\* \* \* \* \*